United States Patent [19]

Matz et al.

[11] Patent Number: 5,349,300
[45] Date of Patent: Sep. 20, 1994

[54] METHOD AND APPARATUS FOR CONTROLLING A PEAK ENVELOPE POWER OF A PA

[75] Inventors: John E. Matz, Hanover Park; James E. Mitzlaff, Arlington Heights, both of Ill.

[73] Assignee: Motorola, Inc., Schaumburg, Ill.

[21] Appl. No.: 104,868

[22] Filed: Aug. 10, 1993

[51] Int. Cl.⁵ .............................. H03G 3/20
[52] U.S. Cl. .................. 330/129; 330/124 R; 330/107
[58] Field of Search .............. 330/107, 124 R, 126, 330/129, 136; 455/115, 126

[56] References Cited

U.S. PATENT DOCUMENTS

| | | | |
|---|---|---|---|
| 4,718,111 | 1/1988 | Jongsma | 330/124 R X |
| 4,811,422 | 3/1989 | Kahn | 330/124 R X |

*Primary Examiner*—Steven Mottola
*Attorney, Agent, or Firm*—Raymond J. Warren; Daniel C. Crilly

[57] ABSTRACT

A method and apparatus is provided for controlling peak envelope power level in a power amplifier (PA) (10). The method includes the steps of measuring (101) a first peak envelope power value of an input of the PA during a first time period, comparing (102) the first peak envelope power value with a threshold value, and introducing a phase change (103) into a selected signal of a plurality of signals being amplified by the PA when the first peak envelope power value exceeds the threshold. The method further includes measuring (104) a second peak envelope power value during a second time period, comparing (105) the first and second peak envelope power values, and reversing (106) the phase change to the selected signal when the second peak envelope power value exceeds the first peak envelope power value.

11 Claims, 4 Drawing Sheets

METHOD AND APPARATUS FOR CONTROLLING A PEAK ENVELOPE POWER OF A PA

FIELD OF THE INVENTION

The field of the invention relates to power amplifiers (PAs) and in particular to a method and apparatus for controlling a peak envelope power of the PA.

BACKGROUND OF THE INVENTION

Cellular systems simultaneously handling a number of traffic channels through each base station are known. Such systems are typically assigned a number of channels ($f_1$-$f_n$) in support of communications with mobile communication units through such local base stations. Each base station is, in turn, allotted a subset of the channels ($f_1$-$f_n$). Of the subset of channels assigned to a base site at least one (and often more) is designated as a control channel for purposes of access control and channel set-up.

Communication with a communication unit on a traffic channel within a service coverage area of the base site is often accomplished through an omnidirectional antenna centrally located within the service coverage area. A number of communications transactions may be simultaneously supported through the antenna with each individual communication supported by a transmitter (located at the base site) assigned to the traffic channel. Each transmitter includes a modulated transmit signal source within the transceiver and a radio frequency (RF) power amplifier). Each transmitter thereby provides signal generation, modulation and amplification.

The simultaneous transmission of a number of traffic channel signals from the central antenna requires that the transmitter output of each active transceiver be combined before application to, and transmission from, the central antenna. In order to avoid interference-producing intermodulation products, signals must be combined after any non-linear steps within the amplification process. In addition, the combining topology must provide sufficient reverse isolation to insure that signals of parallel amplification branches will not be coupled into the output of other power amplifiers, again producing intermodulation products.

Where each transceiver is equipped with its own power amplifier (PA), combining must occur after the PA where signal levels, as well as combining losses, are high. A cavity combiner, for combining such high level RF signals while providing the necessary isolation, is provided by U.S. Pat. No. 4,667,172 assigned to the assignee of the present invention.

In other communication systems, transceivers are not equipped with individual PAs; instead, a common, multitone linear PA (LPA) is used for amplification after the RF signals have been combined at relatively low power levels at the output of the transceiver. The use of such common LPA for traffic channels in systems using a common antenna has resulted in considerable simplification of system topology, improvements in system efficiency, and reduction in system size.

The use of an LPA, on the other hand, has certain disadvantages particularly where RF signals are placed on evenly spaced channel frequencies and phase locked to a common frequency source. In such a case, amplitude fluctuations resulting in signal clipping may occur where a peak envelope power of the composite signal exceeds the LPA's power rating.

FIG. 1 demonstrates the effects of signal phasing in a simplified case involving three signals, A, B, and C, during a time period T. The three signals are shown in FIGS. 1-1, 1-2, and 1-3 respectively. The envelope of the summed composite signal (absolute value of A+B+C) is shown in FIG. 1-4. As may be observed, an envelope peak occurs during the middle of the period (T/2), when all three signals are in phase. The magnitude of this peak can be reduced by reversing the phase of signal C (taking the absolute value of A+B−C), as shown in FIG. 1-5.

Clipping may occur in an LPA when the peak envelope power of the composite input signal (squared envelope magnitude), multiplied by the gain of the LPA, exceeds the peak output power capability of the LPA. Peaks resulting from phase matches have been observed to last for periods of from one to ten seconds, or longer in some systems. Clipping of the RF signal results in the generation of intermodulation products on other RF channels and degradation of system performance.

Clipping due to summation of in phase signals is most severe when the carriers of such signals are unmodulated (during speech pauses) or weakly modulated (during low energy portions of the speech waveform). Full modulation of the carriers produces random variations in the carrier phases which limits the duration of any clipping to time periods on the order of one millisecond. Where the carriers are unmodulated or weakly modulated, however, a repetitive clipping process may occur which is periodic at a rate equal to a frequency difference of contributing carriers. This repetitive clipping process is what gives rise to the generation of strong intermodulation products when the carriers are close in phase.

Past efforts to control peak envelope power due to phase summations have included de-rating of LPAs or intentionally de-correlating frequency references. Derating accommodates phase peaks by requiring an inordinately large LPA. De-correlating frequency references is effective in that where peaks do occur the peaks are very short and, consequently, more easily tolerated. De-correlating carriers, on the other hand, creates problems in synchronization not only in receiving control information on other channels but also in handoff among base sites.

The use of de-correlated (independent) frequency references is expensive and inefficient. The use of an inordinately large LPAs reduces the benefits inherent in signal combining at low power levels. A need exists for a more efficient method of peak envelope power control within a LPA.

SUMMARY OF THE INVENTION

A method and apparatus is provided for controlling a peak envelope power level in a power amplifier (PA). The method includes the steps of measuring a first peak envelope power value of an input of the PA during a first time period, comparing the first peak envelope power value with a threshold value, and introducing a phase change into a selected signal of a plurality of signals being amplified by the PA when the first peak envelope power value exceeds the threshold. The method further includes measuring a second peak envelope power value during a second time period, comparing the first and second peak envelope power values, and reversing the phase change to the selected signal when the second peak envelope power value exceeds the first peak envelope power value.

BRIEF DESCRIPTION OF THE DRAWINGS

FIG. 2 comprises a block diagram of a transmitter section of a cellular base station in accordance with an embodiment of the invention.

FIG. 3 comprises a block diagram of a phase controller in accordance with an embodiment of the invention.

FIG. 4 comprises a flow chart of peak envelope power control in accordance with an embodiment of the invention.

DETAILED DESCRIPTION OF THE PREFERRED EMBODIMENT

The solution to the problem of controlling peak envelope power (PEP) of a LPA lies, conceptually, in the introduction of phase changes, either randomly or under the control of an algorithm, into some or all of the carriers amplified within the LPA. The phase changes are introduced one carrier at a time followed by a PEP measurement. Where a phase change increases PEP over the previous PEP power measurement the previous change is reversed. Where a current PEP is less than the previous measurement the phase change is allowed to remain and the next carrier selected for phase change.

An absolute value of the PEP is taken as an indication of the need for PEP control. Where the PEP exceeds a threshold, phase changes continue one carrier at a time until the PEP is reduced to a point below the threshold. When the PEP again exceeds the threshold, the process is resumed.

Figure 1:
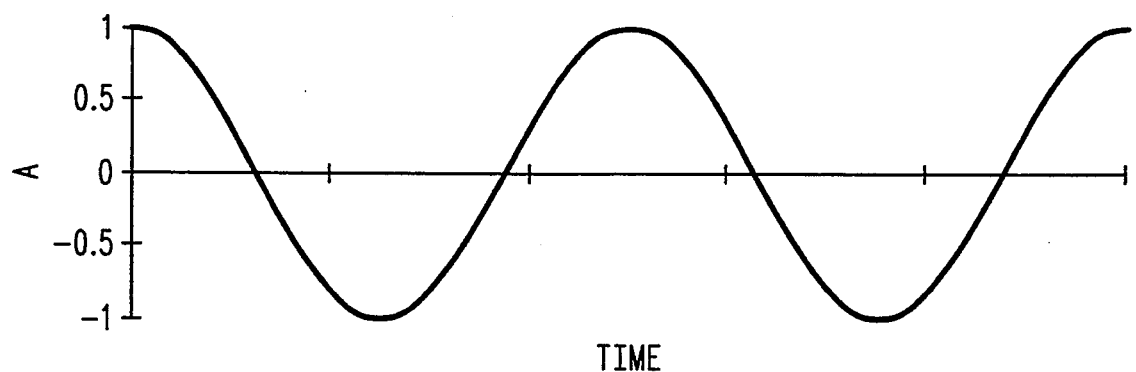
FIGS. 1-1, 1-2, 1-3, 1-4 and 1-5 depict phase summation resulting in peak envelope power peaks in a power amplifier.
Figures 1, 2:
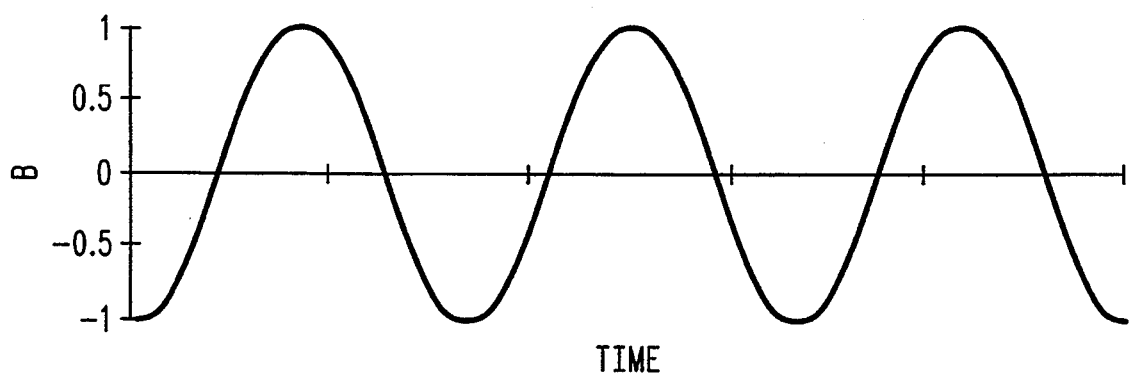
Figures 1, 2, 3:
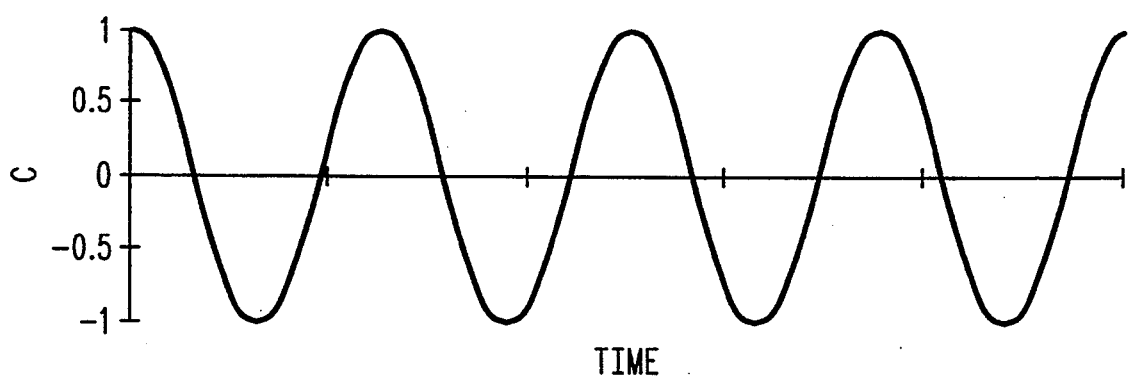
Figures 1, 2, 3, 4:
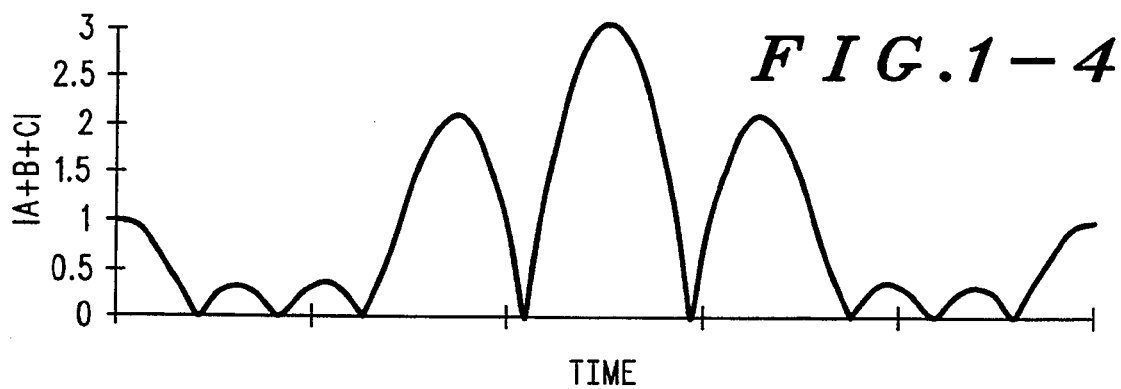
Figures 1, 2, 3, 4, 5:
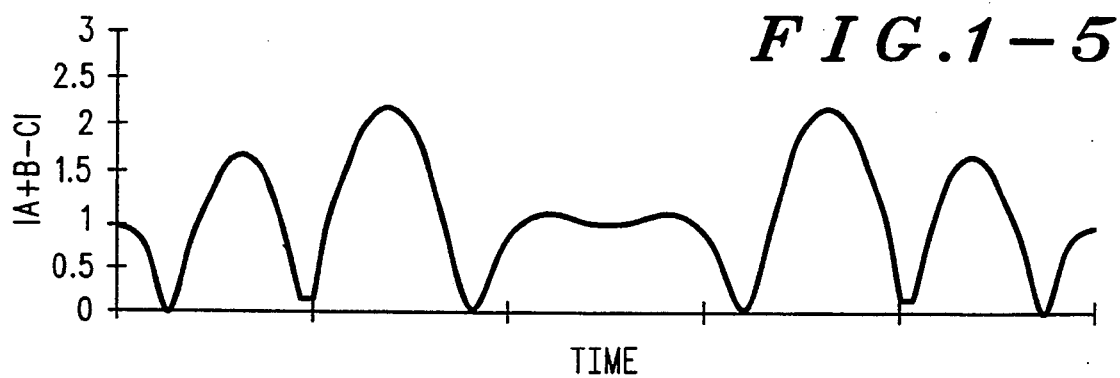
Figure 2:
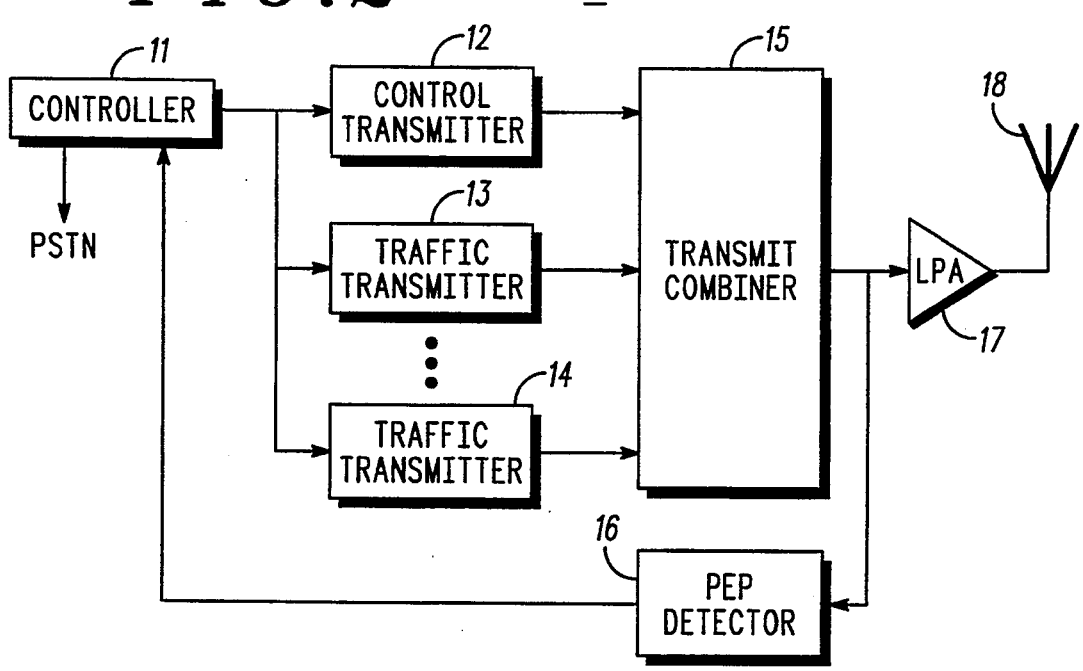
Figure 3:
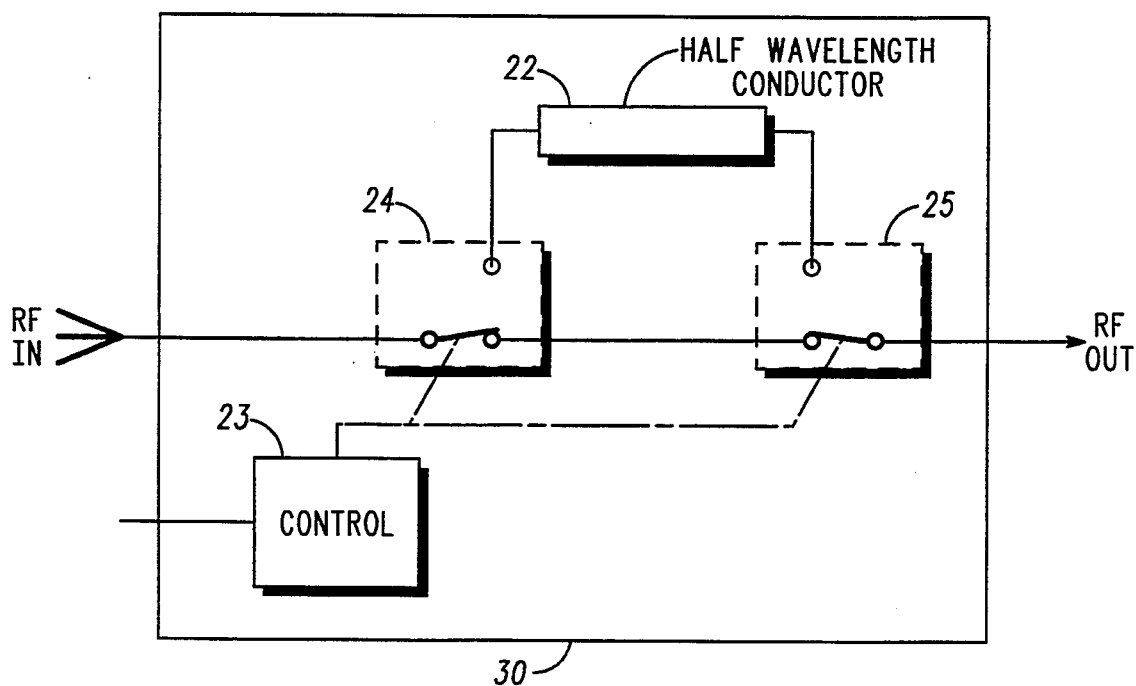
Figure 4:
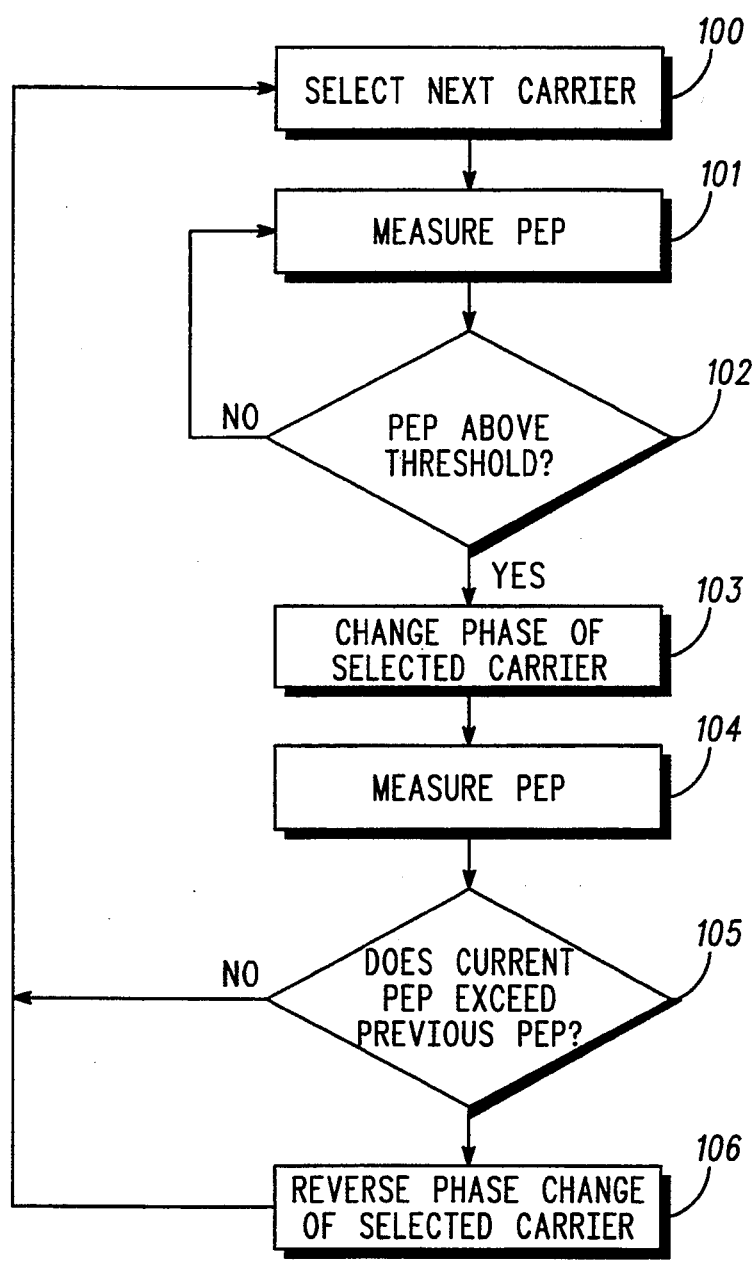

FIG. 4 is a flow chart of the process of PEP control in accordance with an embodiment of the invention. Reference will be made to FIG. 4 as appropriate in understanding the process of the invention.

FIG. 2 is a block diagram of a transmitter section 10 of a cellular power amplifier of a cellular base station in accordance with the invention. Control information intended for a radiotelephone (not shown) is composed within a controller 11, modulated to a carrier frequency within a controller transmitter 12, combined with other signals within a transmit combiner 15, amplified within the LPA 17, and transmitted through an antenna 18. Traffic information, likewise, received by the controller 11, is modulated within traffic transmitters 13-14, combined in the transmit combiner 15, amplifier 17, and transmitted through the antenna 18.

Traffic channel information originating from within a public switch telephone network (PSTN) or another base site (not shown) is routed to appropriate traffic transmitters 13-14 by controller 11. Control information originating within controller 11 is also routed to control transmitter 12 by controller 11. The low-level output signals of transmitters 12-14 are combined within combiner 15 through resistive combining techniques for subsequent amplification within the LPA 17. Within LPA 17 the combined signals are amplified to a level sufficient for transmission through the antenna 18.

Combiner 15 PEP output levels are monitored by the controller 11 through the PEP detector 16. PEP levels measured by the PEP detector 16 are compared with a threshold value stored within the controller 11 for a determination of the need for PEP control. Upon determination for a need for PEP control the controller sequentially introduces phase changes into carriers, one at a time, until the PEP falls below the threshold.

The controller 11 introduces phase changes into individual radio frequency signals produced within the transmitter section 10 through a phase control device located within each of the transmitters 12-14 or their corresponding signal paths in combiner 15. One example of such a phase control device 30 is shown in FIG. 3. This exemplary phase control device 30 is comprised of a control 23, relay devices 24-25, and a one half wavelength conductor 22. The control 23, upon receiving the appropriate command from the controller 11, causes relay devices 24-25 to switch between two states. In the first state the relay devices remain in the quiescent state (shown in FIG. 3) in which the half wavelength conductor 22 is not included within the RF circuit. In the second state, the controller 11 energizes the relay devices 24-25 through control 23, thereby inserting the half wavelength conductor 22 into the RF path. Coupling the half wavelength conductor 22 in the signal path introduces a phase change into a carrier signal equal to a value of $\pi$.

It is to be understood that the phase control device 30 of FIG. 3 is not the only type of phase shifter that could be used in this invention. One possible variant is a phase controller having more than two states, such as one that can produce phase shifts of $\pi/2$, $\pi$, and $3\pi/2$. This can be produced by cascading the phase control device 30 shown in FIG. 3 with a similar phase control device which contains a quarter wavelength conductor in place of the half wavelength conductor 22. Phase control could also be affected through the frequency synthesis circuits in transmitters 12-14, for example, by inserting a phase shift into the reference frequency signal driving a particular synthesizer.

By way of example the transmitter section 10 is operating at full capacity with an RF signal being transmitted through each of the transmitters 12-14. PEP levels are measured 101 by the PEP detector 16 and transferred to the controller 11. Within the controller 11 the PEP values are compared 102 with a threshold value. When the PEP is below the threshold value no action is taken relative to PEP control.

When controller 11 detects 102 that the PEP is above the threshold value, the controller 11 changes 103 the state of the phase control device 30 of a transmitter 12-14 identified within a register (carrier register) in a memory (not shown) of the controller 11. Changing the state of the phase control device 30 of one of transmitters 12-14 causes a phase change of a selected carrier passing through transmitter 12-14 identified by the register.

After changing the state of the phase control device 30 the controller takes a second PEP measurement through the PEP detector 16. The second PEP measurement is compared with the first measurement. Where the second PEP value is smaller than the first PEP value the controller 11 selects 100 another carrier (e.g., by incrementing the contents of the carrier register). Where the second measurement is larger than the first, the controller 11 reverses the phase change. After restoring the phase of the originally selected carrier to an original state, the controller 11 selects another carrier and the process repeats, so long as the PEP value is above the threshold.

Carrier selection for phase changes may be incremental (e.g., each carrier is processed in order) or random.

Where a small number of carriers is used an incremental system provides a simple, easy to implement, process. Where larger number of carriers are used a random process may be indicated.

Control of PEP through adjustment of phase beneficially provides a method of reducing PEP without having an effect on average power. Such an effect can be demonstrated in the simple case demonstrated in FIG. 1-5 where a phase change of $\pi$ to signal C would cause PEP to be reduced. Changing a phase of a carrier in a transmitter of a cellular system would have a much less significant effect because of larger number of carriers. The process of testing each carrier for its effect upon PEP, on the other hand, insures that only the carriers contributing to PEP will be affected. Comparison of PEP with a threshold value ensures that phase changes will only be introduced when a need exists.

The many features and advantages of this invention are apparent from the detailed specification and thus it is intended by the appended claims to cover all such features and advantages of the system which fall within the true spirit and scope of the invention. Further, since numerous modifications and changes will readily occur to those skilled in the art (e.g., phase changes caused by diodes or reactive elements), it is not desired to limit the invention to the exact construction and operation illustrated and described, and accordingly all suitable modifications and equivalents may be resorted to, falling within the scope of the invention.

It is, of course, to be understood that the present invention is, by no means, limited to the specific showing in the drawing, but also comprises any modification within the scope of the appended claims.

We claim:

1. A method of controlling a peak envelope power level in a power amplifier (PA), such method comprising the steps of: measuring a first peak envelope power value of an input of the PA during a first time period; comparing the first peak envelope power value with a threshold value; introducing a phase change into a selected signal of a plurality of signals being amplified by the PA when the first peak envelope power value exceeds the threshold; measuring a second peak envelope power value during a second time period; comparing the first and second peak envelope power values; and reversing the phase change to the selected signal when the second peak envelope power value exceeds the first peak envelope power value.

2. The method as in claim I further including the step of comparing the second peak envelope power value with the threshold and when the second peak envelope power value exceeds the threshold, repeating the steps of claim I for at least a second signal of the plurality of radio frequency signals.

3. The method as in claim 1 wherein the step of introducing a phase change further includes the step of coupling a one-half wavelength transmission line into a radio frequency signal path used by the first signal.

4. A method of reducing a peak envelope power level of a linear power amplifier (LPA), used to amplify a plurality of radio frequency signals, such method comprising the steps of: measuring a first peak envelope power level of the plurality of radio frequency signals at an input of the LPA; changing a phase of a first signal of the plurality of radio frequency signals; measuring a second peak envelope power level; and returning the phase of the first signal to an original state if the second peak envelope power level exceeds the first peak envelope power level.

5. The method as in claim 4 further comprising the step of changing a phase of a second signal of the plurality of radio frequency signals.

6. The method as in claim 4 wherein the step of changing a phase of a first signal further comprises the step of switching a one-half wavelength transmission line into a radio frequency signal path used by the first signal.

7. In a power amplifier amplifying a plurality of radio frequency signals an apparatus for controlling a peak envelope power level, such apparatus comprising: means for measuring a first peak envelope power value of an input of the power amplifier during a first time period; means for comparing the first peak envelope power value with a threshold value; means for introducing a phase change into a first signal of the plurality of radio frequency signals when the first peak envelope power value exceeds the threshold; means for measuring a second peak envelope power value during a second time period; means for comparing the first and second peak envelope power values; and means for reversing the phase change to the first signal when the second peak envelope power value exceeds the first peak envelope power value.

8. The apparatus as in claim 7 further comprising means for comparing the second peak envelope power value with the threshold and when the second peak envelope power value exceeds the threshold, repeating the steps of claim 1 for at least a second signal of the plurality of radio frequency signals.

9. The apparatus as in claim 7 wherein the means for introducing a phase change further comprises means for switching a one-half wavelength transmission line into a radio frequency signal path used by the first signal.

10. An apparatus for reducing a peak envelope power of a radio frequency power amplifier used to amplify a plurality of signals, such apparatus comprising: a peak envelope power detector for detecting a peak envelope power of the plurality of signals; a phase controller for changing a phase of a selected signal of the plurality of signals if the peak envelope power exceeds a threshold; and a controller, operatively coupled to the peak envelope detector and the phase controller, for determining the selected carrier, comparing the peak envelope power detected by the peak envelope power detector with the threshold, and for reversing the phase change if a peak envelope power after the phase change exceeds peak envelope power before the phase change.

11. In a power amplifier used to amplify a plurality of radio frequency signals a method of controlling a peak envelope power, such method comprising the steps of: measuring a first peak envelope power of the plurality of signals; if the first peak envelope power is above a threshold, changing a phase of a selected carrier of the plurality of carriers; measuring a second peak envelope power of the plurality of signals; when the second peak envelope power exceeds the first peak envelope power, reversing the phase change of the selected carrier; and when the second peak envelope power exceeds the threshold selecting a different carrier and repeating previous steps.

* * * * *